(12) United States Patent
Huang et al.

(10) Patent No.: US 7,102,178 B2
(45) Date of Patent: Sep. 5, 2006

(54) SMALL FORMAT OPTOELECTRONIC PACKAGE

(75) Inventors: Nan-Tsung Huang, Tu-Chen (TW); Chong Shin Mou, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 647 days.

(21) Appl. No.: 10/295,588

(22) Filed: Nov. 15, 2002

(65) Prior Publication Data

US 2003/0231671 A1 Dec. 18, 2003

(30) Foreign Application Priority Data

May 30, 2002 (TW) ...................................... 91207933 U

(51) Int. Cl.
*H01L 33/00* (2006.01)

(52) U.S. Cl. .......................... 257/99; 257/81; 257/680; 257/684; 257/80; 257/98; 257/100; 372/36; 372/43; 372/50; 372/92; 372/48

(58) Field of Classification Search ................ 257/99, 257/680, 684, 80, 81, 82, 98, 100; 372/36, 372/43, 50, 92, 48
See application file for complete search history.

(56) References Cited

U.S. PATENT DOCUMENTS

| 4,567,598 A | * | 1/1986 | Noguchi et al. | ............... 372/36 |
| 6,034,424 A | * | 3/2000 | Fujimura et al. | ........... 257/696 |
| 6,163,072 A | * | 12/2000 | Tatoh | ......................... 257/704 |
| 6,556,608 B1 | * | 4/2003 | Gilliland et al. | .............. 372/50 |

* cited by examiner

*Primary Examiner*—Nathan J. Flynn
*Assistant Examiner*—Remmon R. Fordé
(74) *Attorney, Agent, or Firm*—Wei Te Chung

(57) ABSTRACT

An optoelectronic package (10) includes a base substrate (40), a plurality of solder pads (21) and a can (30). The base substrate includes a mounting seat (41) laminated first and second layer (421,422). The solder pads (21) respectively attach to a top surface (412) and a bottom surface (4212) of the base substrate and are electrically interconnected with each other via conductive material filled the through-holes (411,4223,4213) and conductor trace (45,45'). Optoelectronic components (not shown) are attached to the top surface of the base substrate and make electrical connection with the solder pads. The can includes a transparent device (31), an metal enclosure (32) and a housing (33), which hermetically seals to the base substrate protecting the optoelectronic components.

19 Claims, 5 Drawing Sheets

SMALL FORMAT OPTOELECTRONIC PACKAGE

BACKGROUND OF THE INVENTION

1. Field of the Invention

This invention relates generally to optoelectronic packages, and more particularly to a small format optoelectronic package.

2. Description of the Related Art

Optoelectronic devices such as optical transceivers are known in the art and include active optical devices or diode packages. Common diode packages include a metallic housing mounting a laser diode or LED for transmitting data and a photo diode for performing power monitoring, metal contact leads exiting from the diodes for connection to a power source, and a glass window opposed to the diode, through which the energy is transmitted.

Smaller format optoelectronic packages allow the devices into which the optoelectronic packages are placed to become smaller. Smaller optoelectronic packages allow for a higher density of data transmission in a given space. Currently, there is a great demand for smaller optoelectronic packages.

FIG. 5 is a perspective view of a small format optoelectronic package disclosed in U.S. Pat. No. 6,331,992 B1, comprising a monitor diode 70, an optical diode 80, a base substrate 40, a holder 50, and a flex connector 60. The optoelectronic package includes the non-electrically conductive substrate 40 partially covered by an electrically conductive can (not shown). The non-electrically conductive substrate 40 has three through-holes 44(not shown), 45, 46 formed through a thickness of the non-electrically conductive substrate 40. The three through-holes are filled with an electrically conductive material so as to form three electrically conductive vias 44a (not shown) 45a, and 46a. A surface of the non-electrically conductive substrate 40 is organized into three regions (not labeled). The first and third regions have an electrically conductive plating material applied thereto. The optical diode 80 and monitor diode 70 are mounted on the conductive plating of the first region. First and second conductive leads 82, 72 are respectively electrically connected with conductive vias 46a, 45a by the first and second conductors 90, 100.

The optoelectronic package of FIG. 5 has a small diameter and good performance, however, with the increasing demand for packaging more circuits and components in a smaller space, an improved small format package is required.

SUMMARY OF THE INVENTION

An object of the present invention is to provide a small format optoelectronic package adapted for high frequency transmission.

Another object of the present invention is to provide a small format optoelectronic package that is hermetically sealed and easy to install.

A further object of the present invention is to provide a small format optoelectronic package that can provide a more efficient utilization of a limited space.

To achieve the above objects, a small format optoelectronic package is provided in the present invention. The optoelectronic package comprises a can and a base substrate. The base substrate has a mounting seat, a first layer and a second layer. A plurality of solder pads respectively attaches to a top and bottom surfaces of the base substrate, and the solder pads on the top surface are electrically connected to respective solder pads on the bottom surface through inner conductor traces and conductive material filling in through holes on the first and second layers. Optoelectronic devices are mounted on the top surface of the base substrate and are electrically connected to the solder pads on the top surface of the base substrate. The can comprises a transparent device, an metal enclosure that covers the optoelectronic devices and hermetically seals to the base substrate, and a housing that hermetically seals to the base substrate. Electronic circuitry, conductive traces, and optoelectronic components can be sandwiched between the first and second layers of the base substrates.

Other objects, advantages and novel features of the present invention will be drawn from the following detailed description of a preferred embodiment of the present invention with attached drawings, in which:

DETAILED DESCRIPTION OF THE PREFERRED EMBODIMENT

Figure 1:
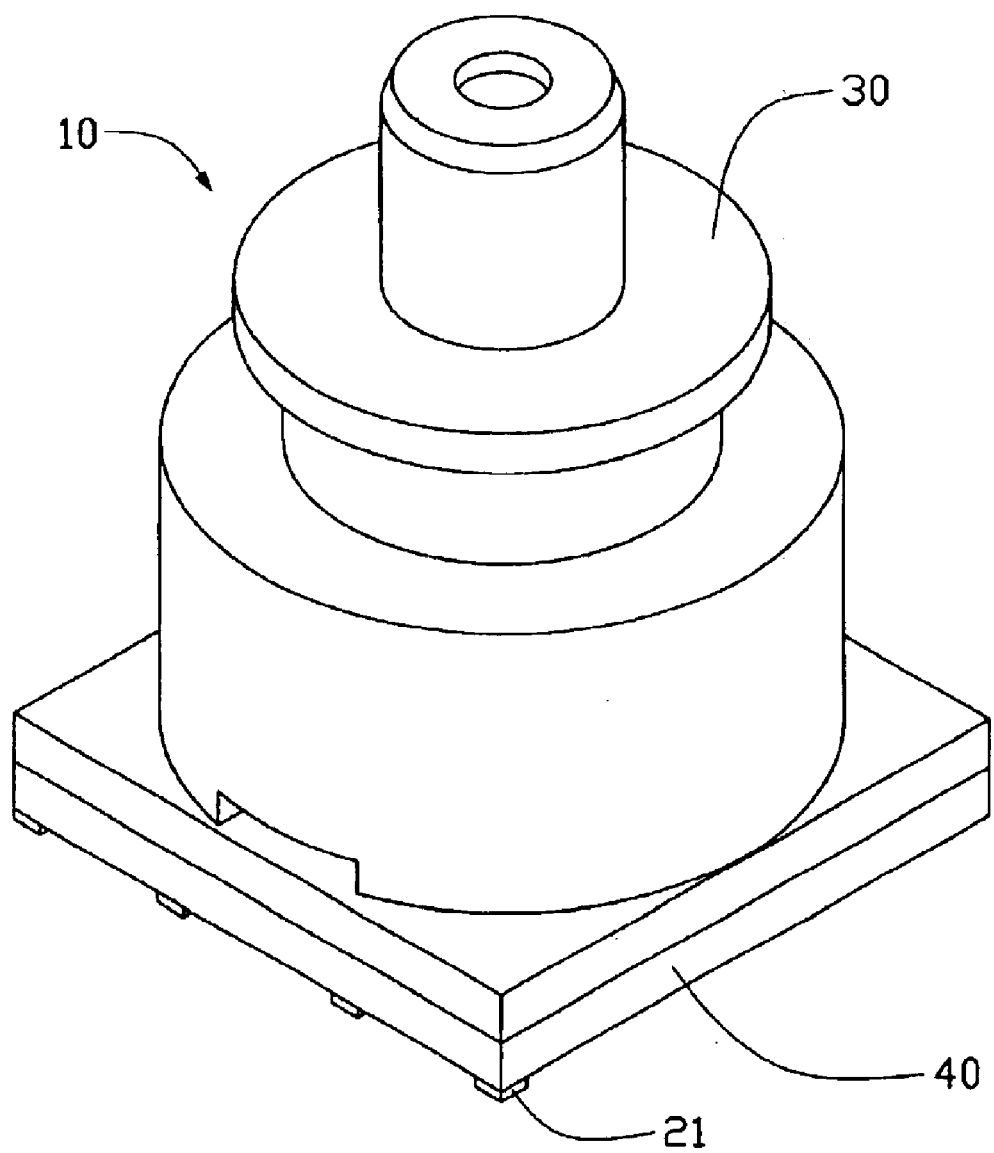
FIG. 1 is a perspective view of a small format optoelectronic package in accordance with the present invention.
Figure 2:
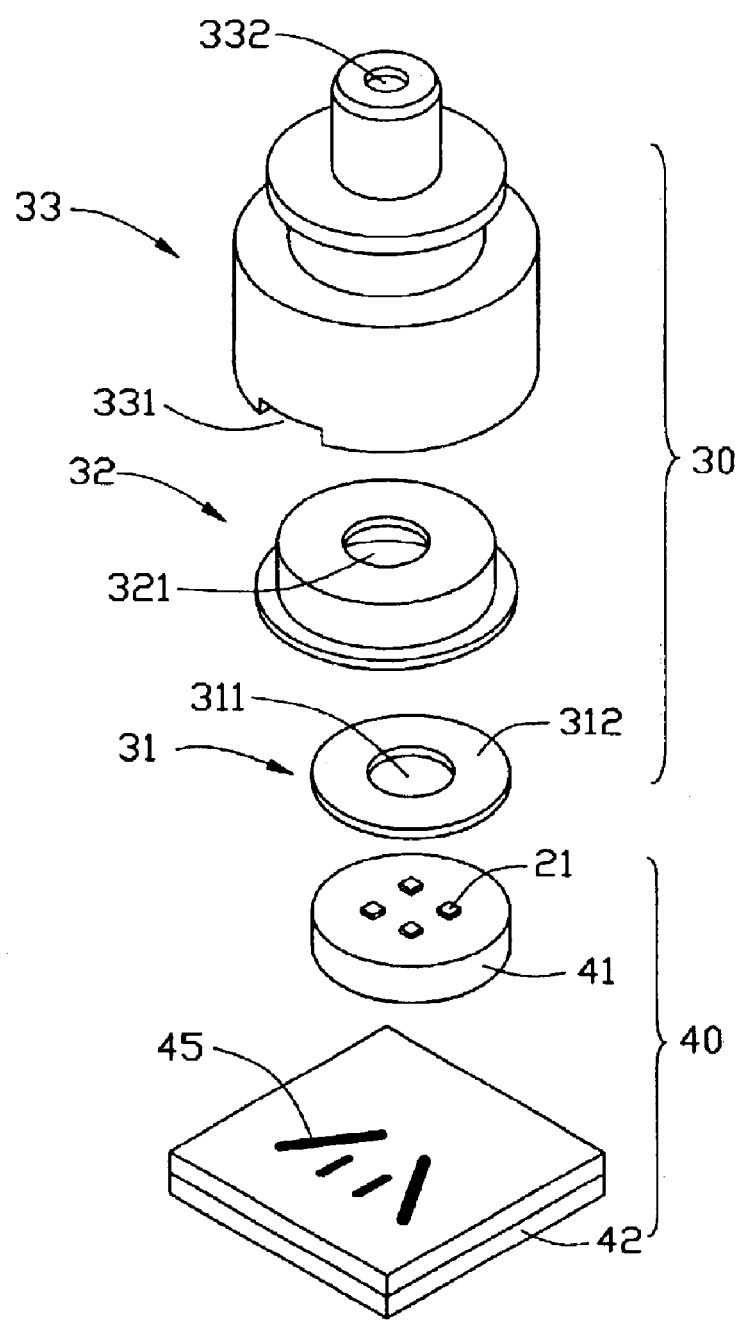
FIG. 2 is an exploded perspective view of the optoelectronic package of FIG 1.

Referring to FIGS. 1 and 2, a small format optoelectronic package 10 comprises a can 30, a base substrate 40 and a plurality of solder pads 21. The can 30 is mounted on and is hermetically sealed to the base substrate 40, and the solder pads 21 are attached to top and bottom surfaces of the base substrate 40.

The bottom plate 42 is made of ceramic material using Low Temperature Cofired Ceramic (LTCC) technology. The LTCC technology allows production of multi-layer circuits using dielectric sheets having conductive, dielectric and resistive areas printed thereon. These single sheets are stacked together and fired at one time, resulting in a single laminated product. This process saves time and money and allows a reduction in circuit dimensions. Another advantage is that every single layer can be inspected and, in the case of inaccuracy or damage, replaced before firing. This saves wastage of sheets and lowers manufacturing cost. A further great advantage is LTCC technology can integrate various passive optoelectronic components or integrated circuits into a laminated sheet. This helps reduce the sheet dimension, thus satisfy a need for minimum packaging.

Because of the low firing temperature of about 850.degree. C., it is possible to use very low resistance conductive materials. The ceramic material used in the base substrate 40 can be Aluminum Nitrogen or Alumina ($Al_2O_3$), and the conductive material may be copper, aluminum, gold or silver. In the present application, the material used in the base substrate is Aluminum Nitrogen because of its favorable heat dissipating properties.

Figure 3:
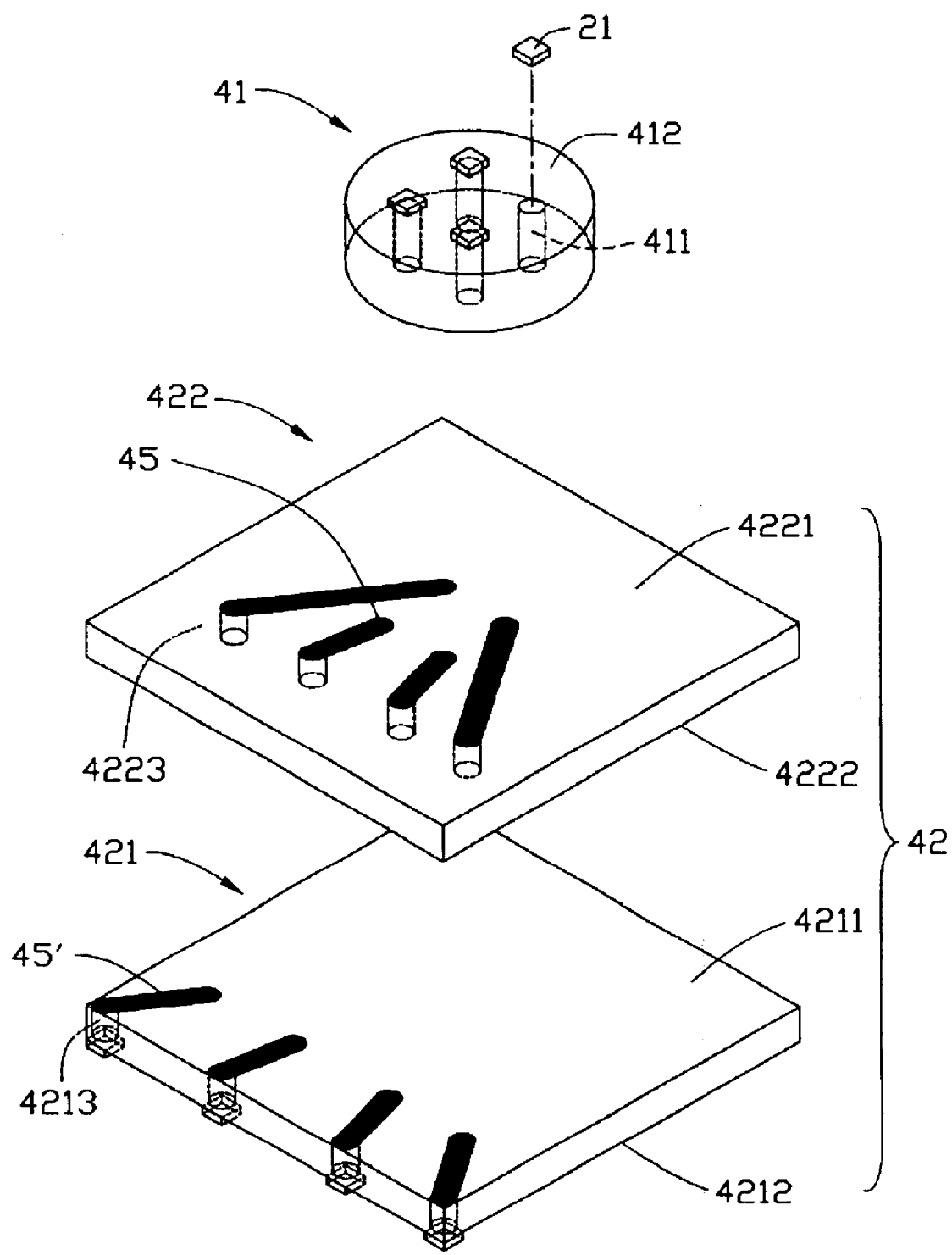
FIG. 3 is an exploded perspective view of a base substrate and solder pads of the optoelectronic package of FIG. 1.

Referring to FIG. 3, the base substrate 40 includes a mounting seat 41 and a bottom plate 42. A plurality of through-holes 411 (only four shown) is formed in the mounting seat 41. These through-holes 411 are filled with conductive material (such as silver or gold). The mounting seat 41 is disk-shaped and has a top surface 412. Various optoelectronic devices such as laser diodes or photo detectors (not shown) can be mounted on the top surface 412. The bottom plate 42 is square in shape and includes a first layer 421 and a second layer 422. The first layer 421 has a first surface 4211 and a bottom surface 4212, and a plurality of through-holes 4213 (only four are shown) is defined on one side thereof, each extending from the first surface 4211 to the bottom surface 4212. Two through-holes 4213 are respectively defined at two corners of the first layer 421, thereby enhancing the reliability of the bond between the bottom plate 42 and a printed circuit board (PCB, not shown) to which the optoelectronic package 10 is mounted. The second layer 422 has a mounting surface 4221 and a second surface 4222, and a plurality of through-hole 4223 (only four shown) is defined therethough. These through-holes 4213,4223 are filled with conductive material. Conductor traces 45 and 45 are respectively printed on the first surface 4211 and the mounting surface 4221, and extend to the top of the through-holes 4213,4223 where they electrically connect with the conductive material therewithin. When the first layer 421 and the second layer 422 are laminated together, the through-holes 4223 in the second layer align with the conductor traces 45' on the first layer.

The mounting seat 41 is laminated on the mounting surface 4221 of the second layer 422, the through-holes 411 in which align with the conductor traces 45 on the second layer 422. Therefore, the conductive material in the through-holes 411 of the mounting seat 41 electrically interconnects with the conductor traces 45, and thus with the bottom plate 42.

The plurality of solder pads 21 (only eight shown) is made of conductive material, such as tin, and is respectively attached to the top surface 412 and to the bottom surface 4212 of the base substrate 40, being directly mounted on the top of the through-holes 411 and on the bottom of the through-holes 4213 and being electrically connected to the conductive material in through-holes 411, 4213. Because of the electrical interconnection between the conductive material in the through-holes 411, 4223, 4213 and the conductor traces 45', 45, respective solder pads 21 attached to the top surface 412 of the base substrate 40 are electrically interconnected with corresponding solder pads 21 on the bottom surface 4212. The solder pads 21 on the bottom surface 4212 can be soldered to corresponding solder pads on the PCB. When the optoelectronic devices are mounted on the mounting seat 41, and are electrically connected to corresponding solder pads 21 on the top surface 412 via conductive wires (not shown), and the solder pads 21 on the bottom surface 4212 electrically connect to the PCB, the optoelectronic devices electrically connect to the PCB.

Referring to FIG. 2, the can 30 comprises a transparent device 31, an enclosure 32, and a housing 33. The transparent device 31 comprises an annular holder 312 and an optical element 311. The preferable optical element 311 is a lens, and is mounted in a center aperture (not labeled) of the holder 312. The enclosure 32 is made of a metal material, is cylindrically shaped, has a short rim protruding from a lower edge of the cylinder, and has an opening 321 defined through a center of a top surface thereof. The transparent device 31 is attached to an inner surface of the top surface of the enclosure 32 with the optical element 311 aligned with the opening 321 of the enclosure 32. The enclosure 32 is fixed to the base substrate 40 with an adhesive and hermetically seals the optoelectronic devices therewithin. The metal housing 33 defines a cavity 331 for accepting the enclosure 32 therewithin. A connection portion 332 is defined through a top of the metal housing 33 and communicates with the cavity 331. An outer device such as an optical fiber engages with the connection portion 332. Light signals emitted from or received by the optoelectronic devices mounted on the mounting seat 41 are collimated or focused by the optical element 311, the light signals pass through the opening 321 when they are output or received from to the outer device.

Figure 4:
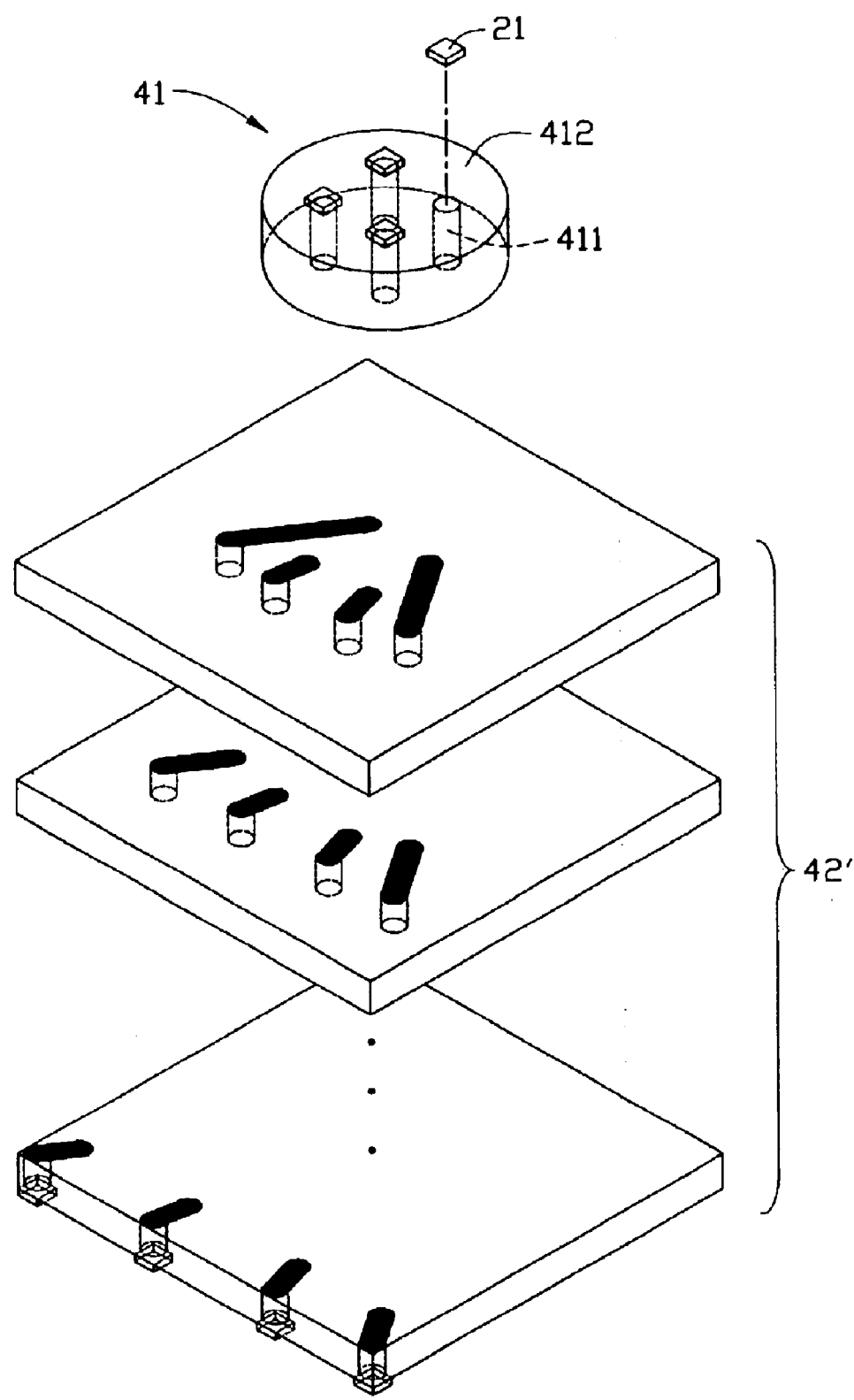
FIG. 4 is an exploded perspective view of another application embodiment of a base substrate and solder pads of the optoelectronic package in accordance of the present invention.
Figure 5:
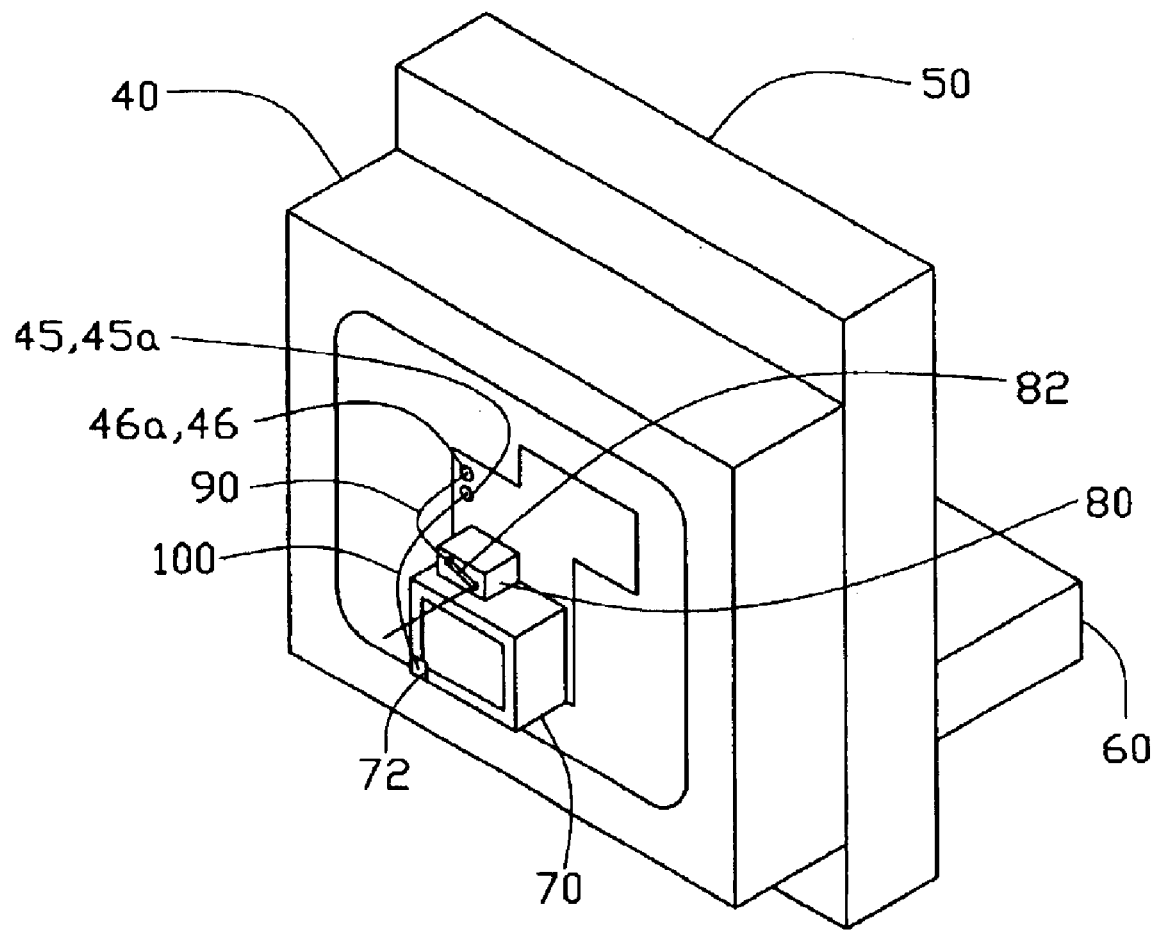
FIG. 5 is a perspective view of a small format optoelectronic package in accordance with the prior art.

See FIG. 4, alternatively, the base substrate 40 can use more than two layers 42 instead of the combination of the first layer 421 and the second layer 422. Also, required components (such as passive optoelecironic components), conductive traces or circuitry can be printed on the first layer 421, the second layer 422 or intervenient layers, the various layers are laminated together.

The finished optoelectronic package 10 can be mounted to the PCB using Surface Mounted Technology (SMT). The solder pads 21 on the bottom surface 4212 of the base substrate 40 are directly soldered to corresponding solders pads on the surface of the PCB.

It should be understood that various changes and modifications to the presently preferred embodiment described herein will be apparent to those skilled in the art. Such changes and modifications may be made without departing from the spirit and scope of the present invention and without diminishing the present invention's advantages. Thus, it is intended that such changes and modifications be covered by the appended claims.

What is claimed is:

1. An optoelectronic package comprising:
   a base substrate having at least three layers, a plurality of through-holes being formed through each layer, each through-hole being filled with conductive material, a plurality of conductor traces being attached on an upper surface of each of the lower layers, each conductor trace electrically connecting to the conductive material in a corresponding through-hole of the some layer and of a next upper layer, thereby forming an electrical connection between conductive material in each through-hole of the top layer to conductive material in a corresponding through hole in the bottom layer; and
   a lens enclosure attaching to the base substrate and hermetically sealing optoelectronic components in a space formed between the can and the base substrate.

2. The optoelectronic package as described in claim 1, wherein a plurality of solder pads is attached to a top surface and a bottom surface of the base substrate, each solder pad locating over a corresponding through-hole in the top or bottom layer of the base substrate and electrically connecting with the conductive material in the through-hole.

3. The optoelectronic package as described in claim 1, wherein the at least three layers are laminated together.

4. The optoelectronic package as described in claim 1, wherein the top layer of the base substrate is made of a low temperature cofired ceramic material.

5. The optoelectronic package as described in claim 1, wherein the top layer of the base substrate is a mounting seat.

6. The optoelectronic package as described in claim 5, wherein optoelectronic components are attached to and electrical connected to the mounting seat.

7. The optoelectronic package as described in claim 6, wherein the lens enclosure is fixed to the base substrate with an adhesive and hermetically seals optoelectronic components therewithin.

8. The optoelectronic package as described in claim 1, wherein the lens enclosure comprises a lens parts and a metal enclosure with a opening, the lens part is mounted in the opening of the lens enclosure.

9. The optoelectronic package as described in claim 1, wherein there are components are located between the layers and are electrically connected to conductor traces of the base substrate.

10. An optoelectronic package, comprising:
- a base substrate having at least three layers, a plurality of through-holes being formed through each layer, each through-hole being filled with conductive material, the top layer of the base substrate is a mounting seat, a plurality of conductor traces being attached on an upper surface of each of the lower layers, each conductor trace electrically connecting to the conductive material in a corresponding through-hole of the some layer and of a next upper layer, thereby forming an electrical connection between conductive material in each through-hole of the top layer to conductive material in a corresponding through hole in the bottom layer;
- a plurality of solder pads attaching to a top surface and a bottom surface of the base substrate, each solder pad locating over a corresponding through-hole in the top or bottom layer of the base substrate and electrically connecting with the conductive material in the through-hole; and
- a lens enclosure with transparent window attaching to the base substrate and hermetically sealing optoelectronic components therein.

11. The optoelectronic package as described in claim 10, wherein the at least three layers are laminated together.

12. The optoelectronic package as described in claim 10, wherein the base substrate is made of a low temperature cofired ceramic material.

13. The optoelectronic package as described in claim 10, wherein optoelectronic components are attached to and electrical connected to the mounting seat.

14. The optoelectronic package as described in claim 13, wherein the lens enclosure is fixed to the base substrate with an adhesive and hermetically seals optoelectronic components therewithin.

15. The optoelectronic package as described in claim 10, wherein the lens enclosure comprises a lens part and a metal enclosure with an opening, the lens part is mounted in the opening of the enclosure.

16. The optoelectronic package as described in claim 15, wherein a short rim extends from an edge of the lens enclosure for attaching to the base substrate, a housing attaches to and covers to the lens enclosure.

17. The optoelectronic package as described in claim 1, wherein there are passive components are located between the layers and are electrically connected to conductor traces of the base substrate.

18. An optoelectronic package comprising:
- a base substrate including a mounting seat and at least two layers bottom plate;
- the mounting seat defining a plurality first vertical through holes with conductors formed on opposite upper and lower ends of the first through holes, said first vertical through holes arranged in a matrix manner;
- the bottom plate including an upper layer defining a plurality of second vertical through holes with conductors formed on opposite upper and lower ends of the second vertical through holes, the second vertical through holes arranged in a diverse manner compared with said matrix type first vertical through holes, each of first conductive traces formed between the corresponding upper end of the second vertical through hole and lower end of the first vertical through hole;
- the bottom plate further including a lower layer defining a plurality of third vertical through holes with conductors formed on opposite upper and lower ends of the third vertical through holes, the third vertical through holes arranged in a linear manner closely parallel to said edge of the bottom plate, second conductive traces formed between the corresponding upper end of the third vertical through hole and lower end of the second vertical through hole; wherein
- a housing is seated upon the bottom plate and encloses said mounting seat without exposing either first or second conductive traces.

19. The package as described in claim 18, wherein said first conductive traces are formed on a top surface of the upper layer of the bottom plate.

* * * * *